(12) United States Patent
Mathew et al.

(10) Patent No.: US 7,829,447 B2
(45) Date of Patent: Nov. 9, 2010

(54) SEMICONDUCTOR STRUCTURE PATTERN FORMATION

(75) Inventors: Leo Mathew, Austin, TX (US); Rode R. Mora, Austin, TX (US); Tab A. Stephens, Buda, TX (US); Tien Ying Luo, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1051 days.

(21) Appl. No.: 11/419,304

(22) Filed: May 19, 2006

(65) Prior Publication Data

US 2007/0269969 A1 Nov. 22, 2007

(51) Int. Cl.
*H01L 21/22* (2006.01)
*H01L 21/38* (2006.01)
(52) U.S. Cl. .................. 438/551; 438/197; 438/942; 257/E21.442; 257/E21.703
(58) Field of Classification Search .................. 438/758, 438/551, 163, 197–199, 43–48, 216, 585; 257/E21.442, E21.703
See application file for complete search history.

(56) References Cited

U.S. PATENT DOCUMENTS

| 5,117,271 | A | | 5/1992 | Comfort et al. |
|---|---|---|---|---|
| 5,783,470 | A | | 7/1998 | Rostoker |
| 5,872,031 | A | * | 2/1999 | Mishra et al. ............... 438/216 |
| 6,951,784 | B1 | | 10/2005 | Anderson et al. |
| 2005/0063215 | A1 | * | 3/2005 | Yang .......................... 365/154 |
| 2005/0239242 | A1 | * | 10/2005 | Zhu et al. ................... 438/199 |
| 2006/0046393 | A1 | * | 3/2006 | Kato .......................... 438/268 |
| 2006/0084243 | A1 | * | 4/2006 | Zhang et al. ................ 438/478 |

OTHER PUBLICATIONS

International Search Report from corresponding PCT application dated Oct. 24, 2007.

* cited by examiner

*Primary Examiner*—Alexander G Ghyka
*Assistant Examiner*—Abdulfattah Mustapha
(74) *Attorney, Agent, or Firm*—David G. Dolezal; James L. Clingan, Jr.

(57) ABSTRACT

Forming structures such as fins in a semiconductor layer according to a pattern formed by oxidizing a sidewall of a layer of oxidizable material. In one embodiment, source/drain pattern structures and a fin pattern structures are patterned in the oxidizable layer. The fin pattern structure is then masked from an oxidation process that grows oxide on the sidewalls of the channel pattern structure and the top surface of the source/drain pattern structures. The remaining oxidizable material of the channel pattern structure is subsequently removed leaving a hole between two portions of the oxide layer. These two portions are used in one embodiment as a mask for patterning the semiconductor layer to form two fins. This patterning also leaves the source/drain structures connected to the fins.

21 Claims, 12 Drawing Sheets

SEMICONDUCTOR STRUCTURE PATTERN FORMATION

BACKGROUND OF THE INVENTION

1. Field of the Invention

This invention relates in general to semiconductor devices and more specifically to forming a pattern for structures of a semiconductor device.

2. Description of the Related Art

FinFETs (e.g. MIGFets, ITFet, multiple fin FinFETs) include vertical channel regions located in semiconductor fin structures. An advantage with some types of finFETs is that a channel width dimension of a FinFET is located along the vertical height of the fin, there by allowing for more transistor drive current per die area. Such may also be true of other types of transistors having vertical channel structures and substantially horizontal carrier transport.

With some FinFETs, the width of the fin structure is usually at the critical dimension of the lithographic process. Some techniques for further reducing fin width include forming a first fin or other type of structure and then forming spacers adjacent to the first fin. The spacers adjacent to the first fin are then used to pattern the semiconductor fin structures.

One challenge of using spacers to define the semiconductor fin structures is that the first fin may have to meet height-to-width ratio parameters for proper spacer formation. Accordingly, the distance between the resultant two spacers (and subsequently between the two semiconductor fin structures) maybe somewhat more separated than desired.

What is needed is an improved process for forming a pattern for a structure in a semiconductor device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

FIGS. 1-23 show various views during the manufacture of a FinFET accordingly to one embodiment of the invention. In the embodiment shown, a pattern for structures such as channel structures (e.g. a fin of a FinFET) are formed by oxidizing an oxidizable material of a patterning layer.

Figure 1:
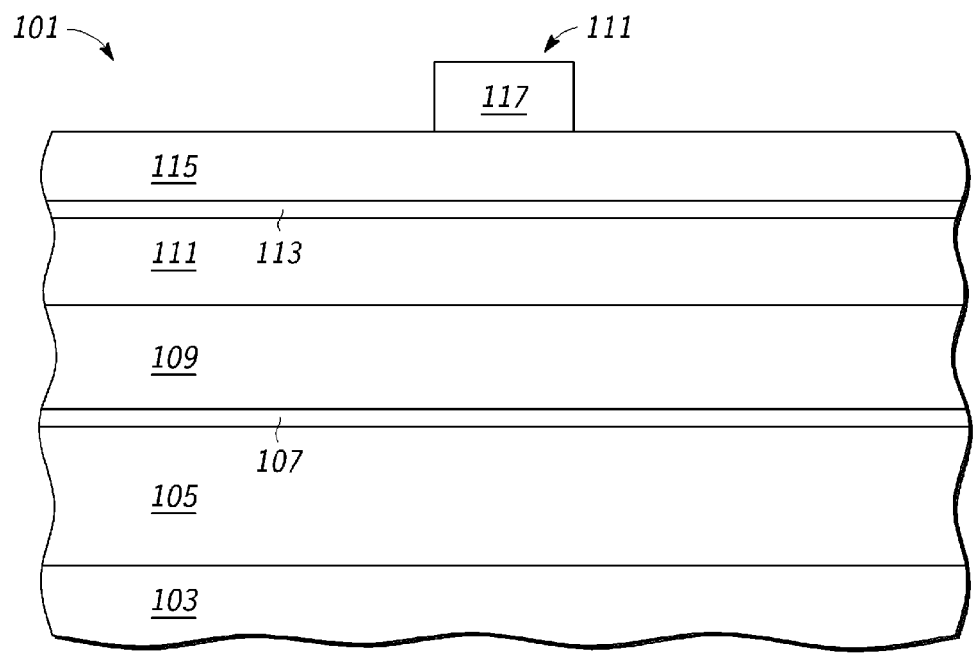
FIGS. 1, 3, 7, 9-12, 14, 16, 17, 19, 20, and 22 are partial side cutaway views of a wafer during various stages of its manufacture according to one embodiment of the present invention.

FIG. 1 is a partial side cross sectional view showing a wafer from which a FinFET will be subsequently formed. In the embodiment shown, wafer 101 has a semiconductor on insulator (SOI) substrate configuration where (in the embodiment shown) an insulating layer 103 is located on a bulk layer e.g. of bulk silicon (not shown). The substrate includes a semiconductor layer 105 located on layer 103. Layer 105 is made of a semiconductor material (e.g. mono crystalline silicon, silicon carbon, silicon germanium, silicon germanium carbide, gallium, gallium arsenide, indium arsenide, indium phosphide, or other Group III-IV compound semiconductor material, or any combination thereof). Layer 105 will be subsequently patterned to form semiconductor fin structures and source/drain structures of a multiple fin structure. In one embodiment, layer 105 has a thickness of 500-1500 angstroms, but maybe of other dimensions in other embodiments. In other embodiments, the wafer would not include layer 103 wherein layer 105 would be a layer of bulk semiconductor material.

Oxide layer 107 (e.g. silicon oxide) is located on layer 105. In one embodiment, layer 107 is 50-200 angstroms thick but may be of other dimensions in other embodiments including of greater thicknesses. Layer 107 serves to protect layer 105 during processes performed on layer 109 and allows for a reduced stressed growth of nitride layer 109 over layer 105.

Nitride layer 109 (e.g. silicon nitride) is located on layer 107. In one embodiment, nitride layer 109 is 300-700 angstroms thick, but may be of others thicknesses in other embodiments. In some embodiments, a pattern is subsequently formed in layer 109 for the patterning of layer 105.

A oxidizable material layer 111 is located on layer 109. In one embodiment, layer 111 is made of amorphous silicon and has a thickness of 50-300 angstroms, but may be made of other materials and/or of other thicknesses in other embodiments. For example, in other embodiment, oxidizable material layer 111 is made of nitride. In such embodiments, the nitride is oxidizable with a ISSG (in situ steam generated) oxidation process.

Oxide layer 113 is located on layer 111. Oxide layer 113 is 50-100 angstroms thick in one embodiment, but may be of other dimensions in other embodiments. Oxide layer 113 allows for a reduced stressed growth of nitride layer 115 over amorphous silicon layer 111.

Nitride layer 115 is located on layer 113. In some embodiments, nitride layer 115 is of a thickness ranging from 100-300 angstroms but maybe of other dimensions in other embodiments. Nitride layer 115 is utilized as a mask to prevent selected portions of layer 111 from oxidation in subsequent processes.

Figure 2:
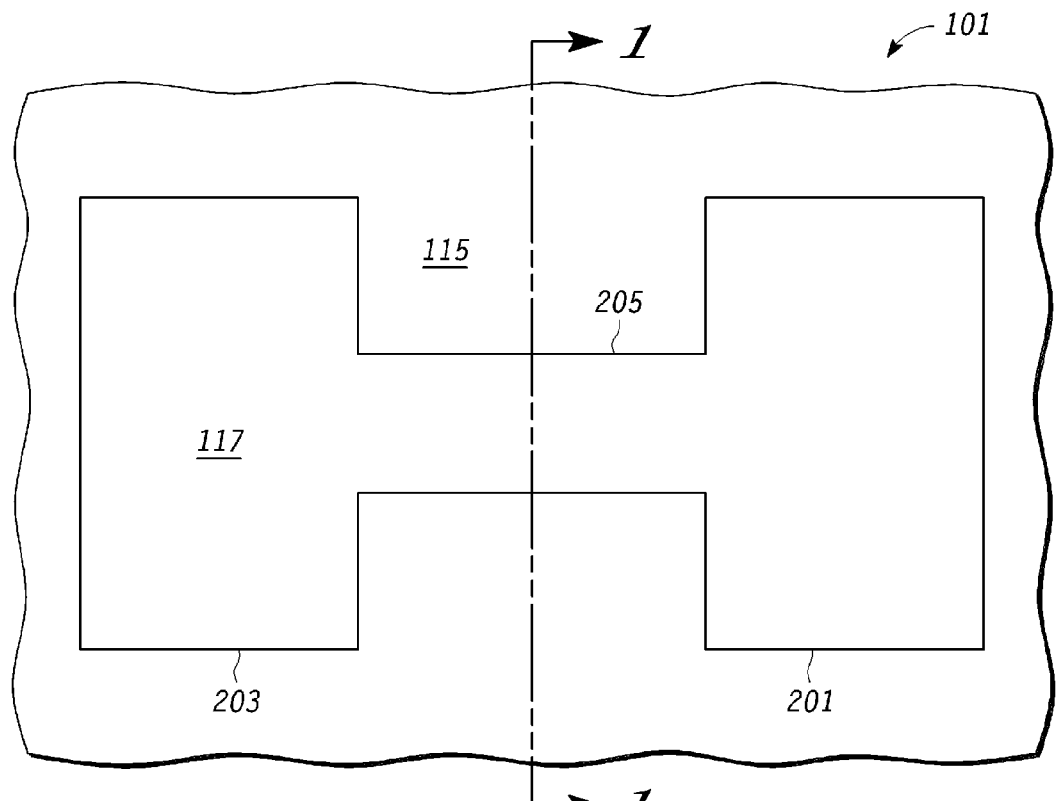
FIGS. 2, 4-6, 8, 13, 15, 18, 21, and 23 are partial top views of a wafer during various stages of its manufacture according to one embodiment of the present invention.

Layer 115 is initially patterned by patterning a photo resist layer 117 or other patterning material (TEOS, amorphous carbon, or combinations thereof) to form a general pattern of a multi-fin semiconductor structure for a FinFET. FIG. 2 shows a top view of the pattern of layer 117 which is patterned by conventional photo-lithographic techniques. FIG. 2 shows a FinFET structure pattern with the pattern for one fin structure 205 located between the patterns for source/drain structures 203 and 201 of layer 117.

Figure 3:
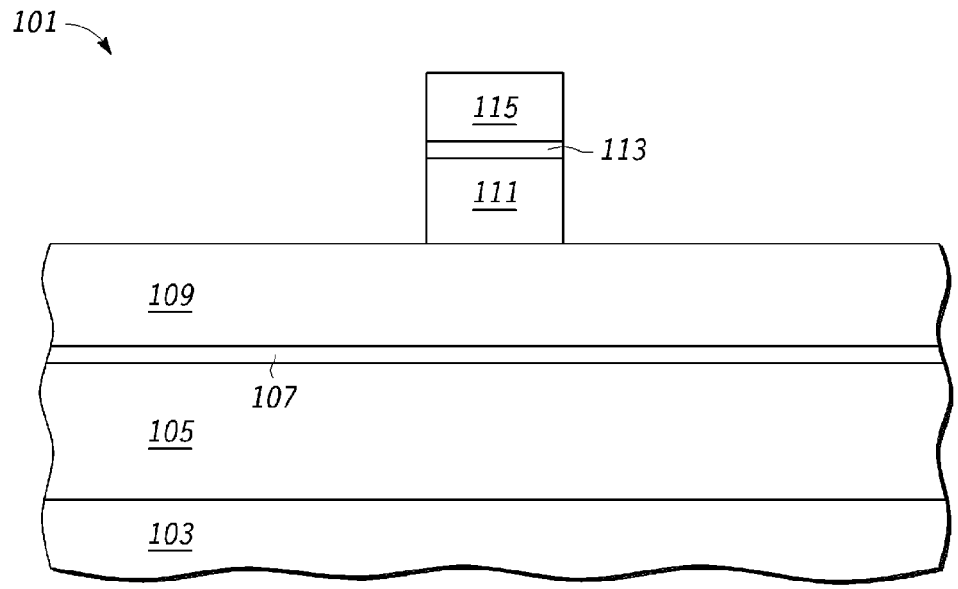

Referring to FIG. 3, from the patterned structure of layer 117 (as shown in FIG. 2), layers 115, 113, and 111 are patterned according to the pattern. In one embodiment, these layers are patterned with etch chemistries for etching the material of those layers. In one embodiment, layers 115 and 113 are etched with $CH_4$ and $CHF_3$ gases. Layer 111 would be partially etched with the same etch chemistry in one embodiment, wherein the remaining portion of layer 111 would be etched with HBr, $CL_2$, $O_2$, and $CF_4$ gases. In other embodiments, each layer may be etched with a different gas chemistry. However, other etch chemistries may be used in other embodiments. An etch chemistry is "selective to" one material with respect to another material when it etches the one material at a relatively slower rate than the another material that is desired to be removed. After etching layers 115, 113, and 111, the patterned structure of layer 117 is removed.

Figure 4:
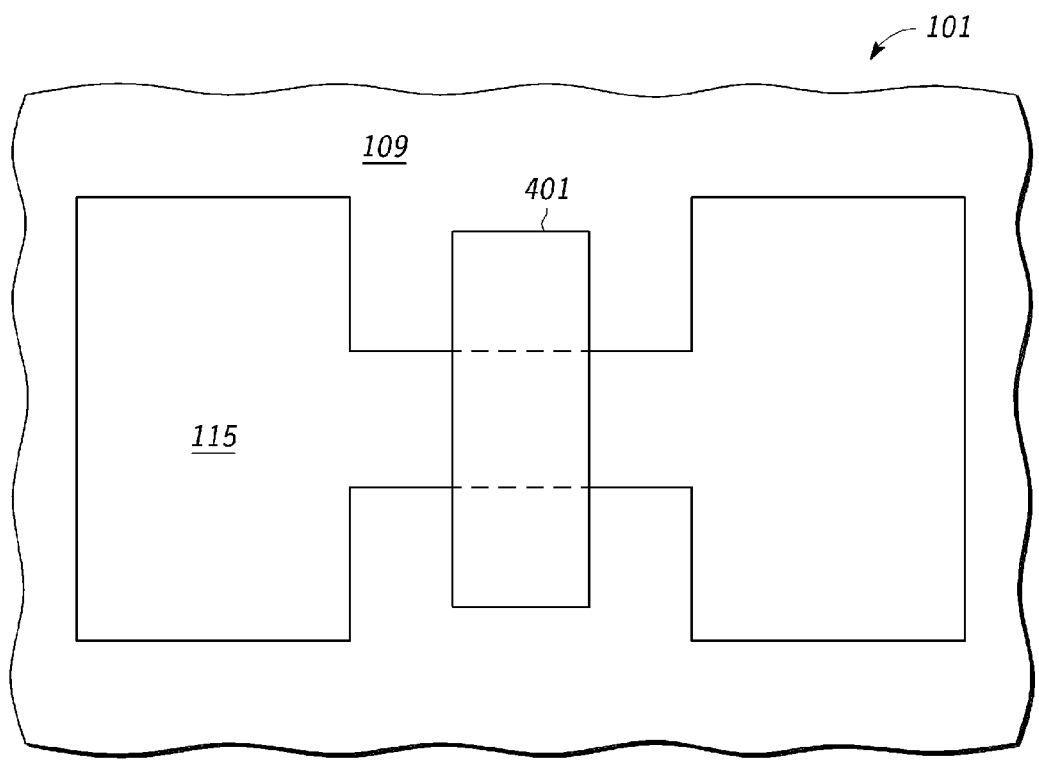
Figure 5:
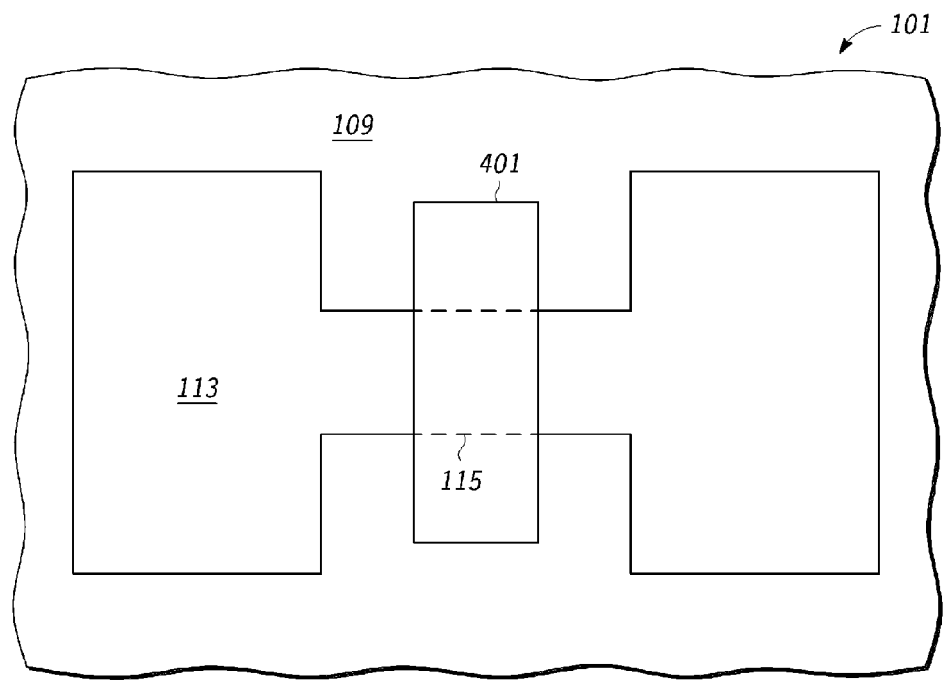

FIG. 4 shows a partial top view of wafer 101 after a patterned channel structure definition mask 401 is formed over wafer 101. In one embodiment, mask 401 is made of photo resist or other masking material. Mask 401 is used to pattern nitride layer 115. FIG. 5 shows a partial top view of wafer 101 after the removal of portions of layer 115 located outside of mask 401 on a remaining portion of layer 113.

Figure 6:
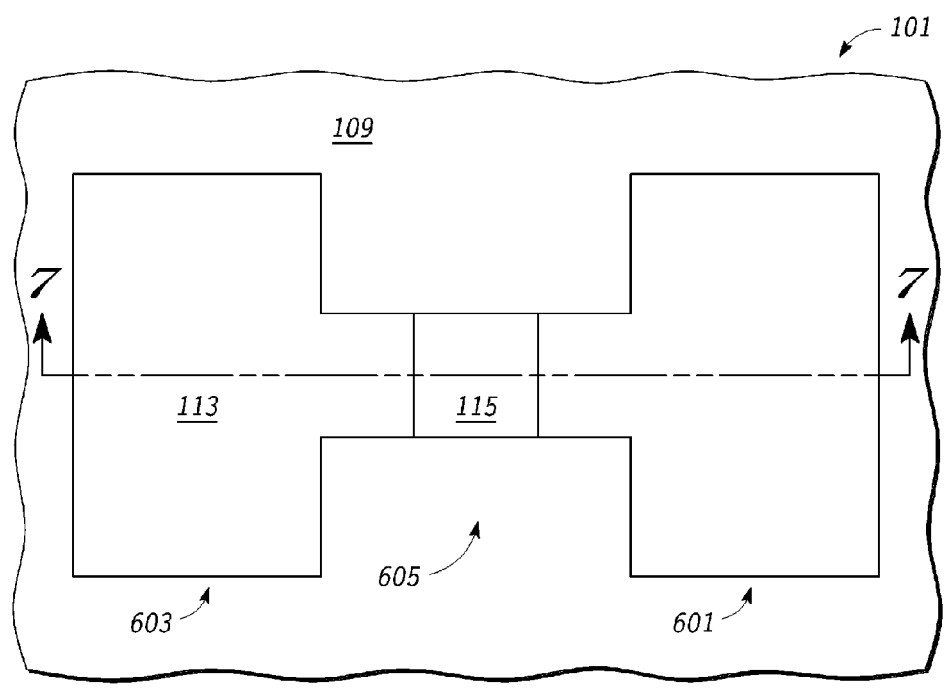

FIG. 6 is a top view of wafer 101 after mask 401 is removed to leave an exposed portion of nitride layer 115 in region 605. In regions 603 and 601, the nitride layer 115 has been removed prior to the removal of mask 401 to leave layer 113 exposed (e.g. by conventional etch processes).

Figure 7:
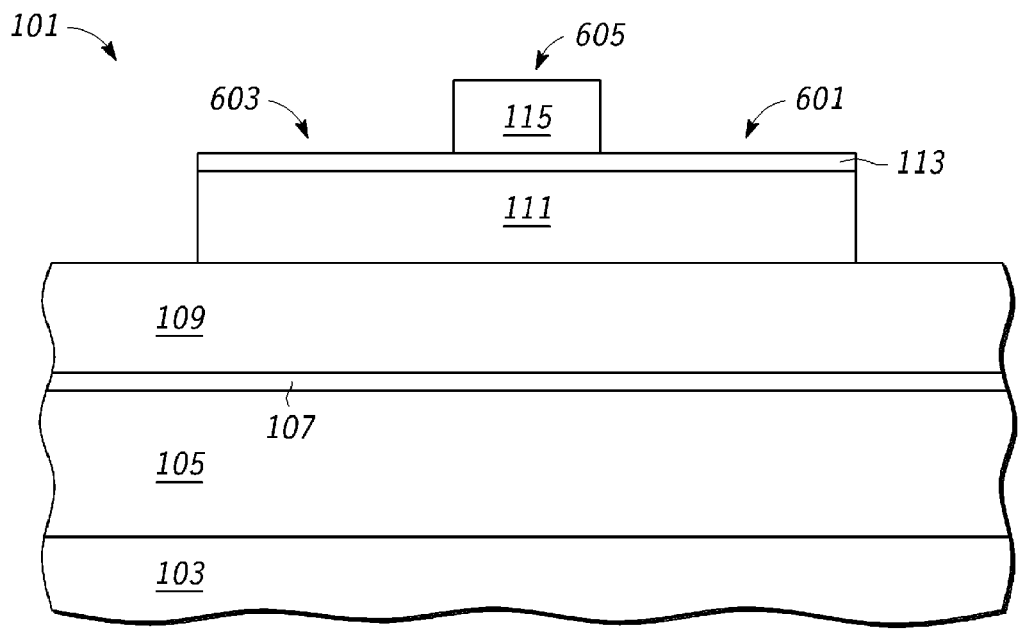

FIG. 7 shows a partial side view of wafer 101 at the same stage as that shown in FIG. 6. Note that a portion of nitride layer 115 remains in region 605 but has been removed in regions 603 and 601.

After the stage shown in FIGS. 6 and 7, wafer 101 is subject to an oxidation process to oxidize the material of layer 111. In one embodiment, the oxidation process is performed by subjecting wafer to furnace oxidation which exposes the wafer to high temperatures (e.g. 1000-1100 C) in the presence of oxygen. In one embodiment, the furnace oxidation process provides high quality oxide with a controlled growth rate. However, in other embodiments, other oxidation processes may be used including e.g. rapid thermal anneal.

Figure 8:
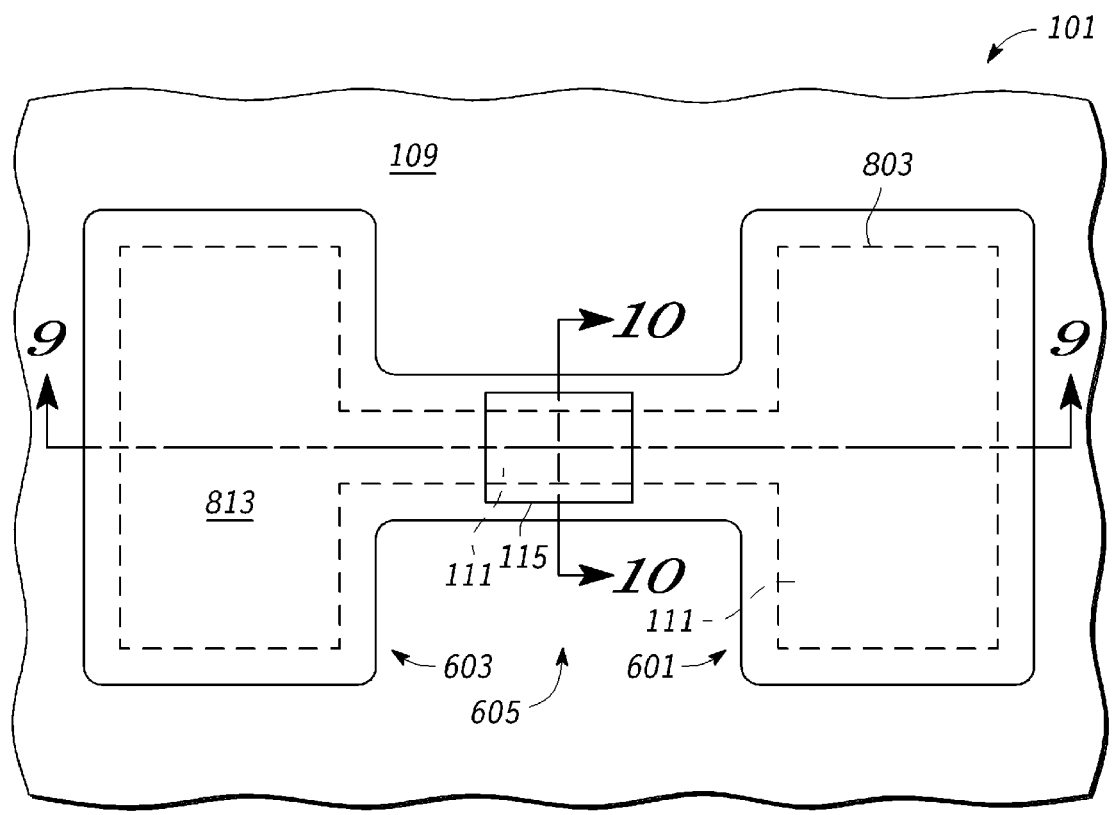
Figure 9:
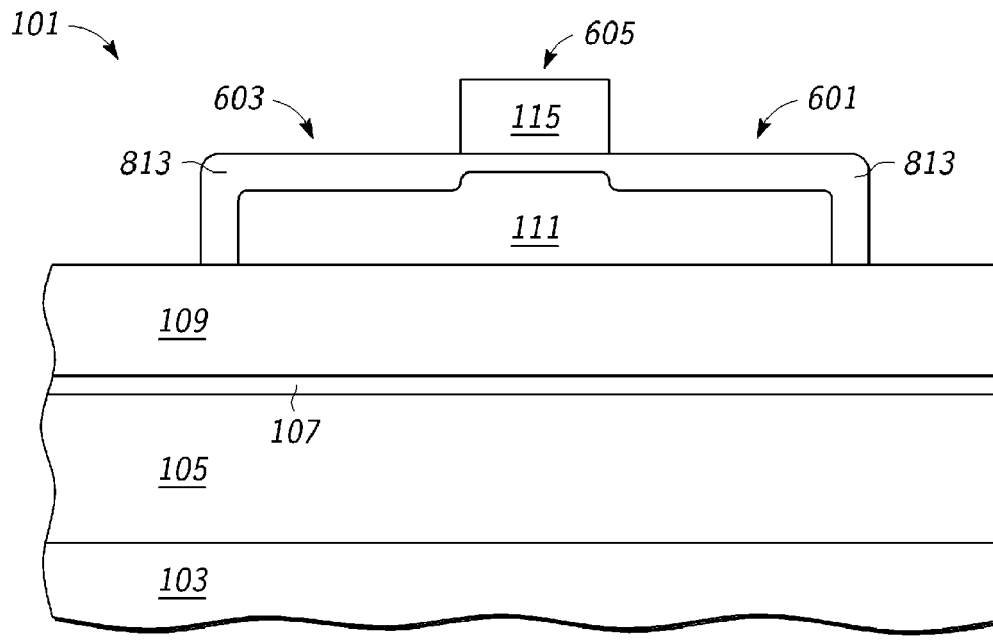
Figure 10:
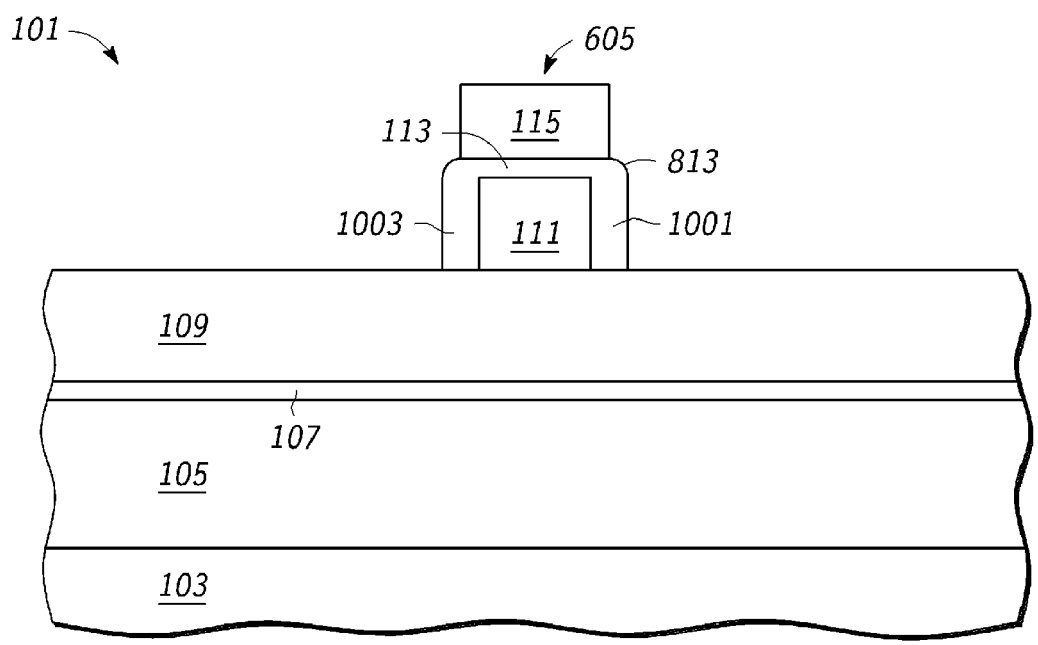

FIG. 8 is a partial top view of wafer 101 after the oxidation. FIG. 9, is a partial side cross sectional view of wafer 101 at the same stage. FIG. 10 is a partial side cross sectional view of wafer 101 at the same stage wherein the view of FIG. 10 is rotated 90 degrees from the view of FIG. 9.

Referring back to FIG. 8, in one embodiment, the oxidation process oxidizes the exposed sidewalls of layer 111 in regions 601, 603, and 605 such that oxide 813 is formed on those sidewalls. See dashed line 803 in FIG. 8 that defines the inward extent of oxide 813 on the sidewalls. Also, oxide 813 is formed on the top of layer 111 in regions 601 and 603 due to oxygen penetration of the layer 113. In the Figures, layer 113 is shown as part of oxide 813.

During the oxidation process, the upper portion of layer 111 located in region 605 is not oxidized due to the protection provided by the portion of layer 115 in region 605. See for example, FIG. 9 where the portion of oxide 813 under the portion of layer 115 in region 605 is at same thickness as layer 113.

The oxidation process consumes a portion of layer 111. Accordingly, a greater portion of layer 111 remains in region 605 due to protection provided by layer 115 in that region than in regions 601 and 603.

Referring to FIG. 10, oxide 813 includes oxide structures 1001 and 1003 formed on the sidewalls of the portion of layer 111 in region 605. Structures 1001 and 1003 will subsequently be used to define the fin structures formed in semiconductor layer 105.

Also, as shown in the embodiment of FIGS. 8, 9, and 10, oxide 813 grows beyond the original extent of the portion of layer 113 as originally patterned (see the view of FIG. 6 for comparison). Accordingly, oxide structures 1001 and 1003 extend out from the portion of layer 115 shown in FIG. 10.

Figure 11:
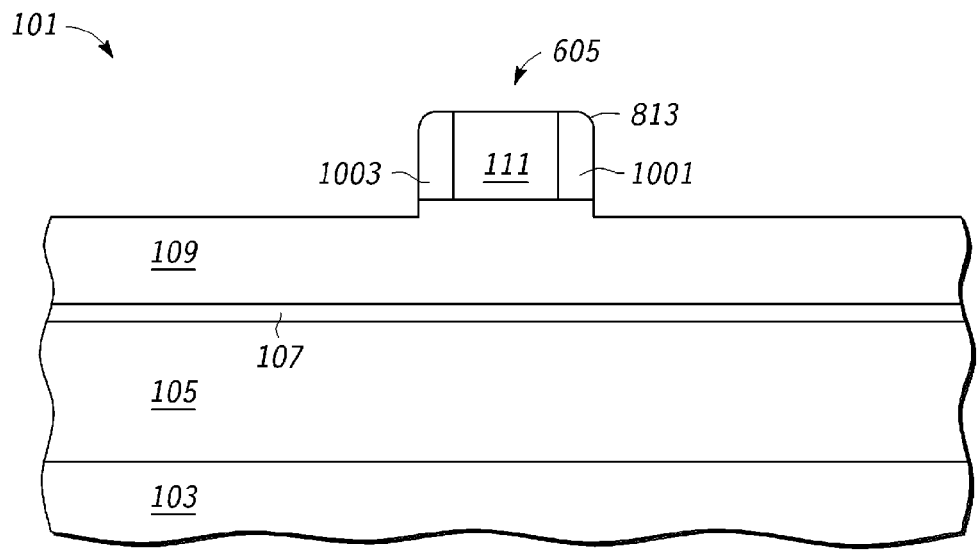

FIG. 11 shows wafer 101 after the removal of the remaining portion of nitride layer 115 in region 605 and the subsequent removal of the portion of oxide 813 over the portion of layer 111 in region 605. In one embodiment, the remaining portion of nitride layer 115 is removed by subjecting wafer 101 to an etch to remove the nitride selective to oxide 813. In one embodiment, the etch chemistry includes $CH_3F$ and $O_2$ gases.

During the etch of the remaining portion of layer 115, a top exposed portion of nitride layer 109 is removed as well. However, a sufficiently thick portion of layer 109 remains after the etching.

Also as shown in FIG. 11, the portion of layer 113 (shown as part of oxide 813 in FIG. 10) over the portion of layer 111 in region 605 is removed by subjecting wafer 101 to an etch that removes the oxide and is selective to nitride. This etch is controlled such that only a small thickness of the top of oxide 813 is removed in regions 601 and 603 and on structures 1003 and 1001. In one embodiment, a time etched is utilized for a controlled removal of the oxide. Other controlled oxide etching techniques may be used in other embodiments. The removal of this oxide exposes layer 111 in region 605.

Figure 12:
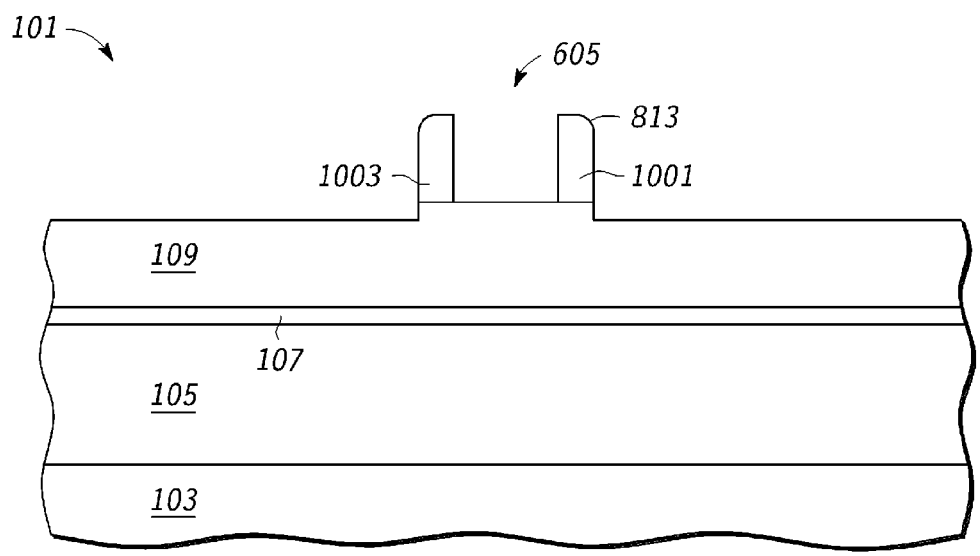

FIG. 12 shows a partial side view (the same side view as FIG. 11) after exposed portions of silicon layer 111 have been removed. In one embodiment, the exposed material (e.g. amorphous silicon) of layer 111 is removed by an etchant that is selective to oxide and nitride and is selective with respect to the material of layer 111.

Figure 13:
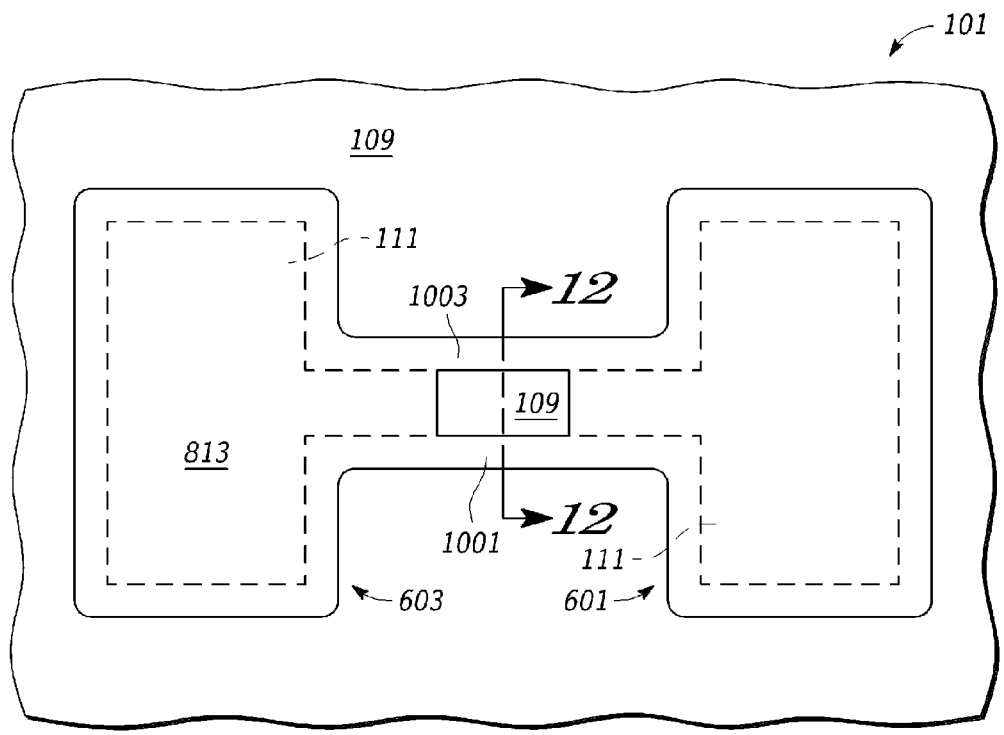

FIG. 13 shows a partial top view of wafer 101 at the same stage as FIG. 12. As shown in FIG. 13, removal of the portion of layer 111 in region 605 exposes layer 109 in that region. Also, as shown in FIG. 13, some portions of layer 111 may remain in regions 601 and 605 (as shown by the dashed lines in FIG. 13) but are covered by oxide 813. In the embodiment, because regions 601 and 603 were not covered by nitride layer 115 during the oxidation process, oxide 813 is relatively much thicker over layer 111 in those regions than in region 605. Thus, removal of oxide 813 over layer 111 in region 605 does not remove all of oxide 813 over layer 111 in regions 601 and 603.

In some embodiments, layer 111 may be oxidized to the degree that all of layer 111 (from the view shown in FIG. 7) outside of region 605 is oxidize. In such embodiments, at the stage of FIG. 13, all material above layer 109 in regions 601 and 603 would be oxide.

Figure 14:
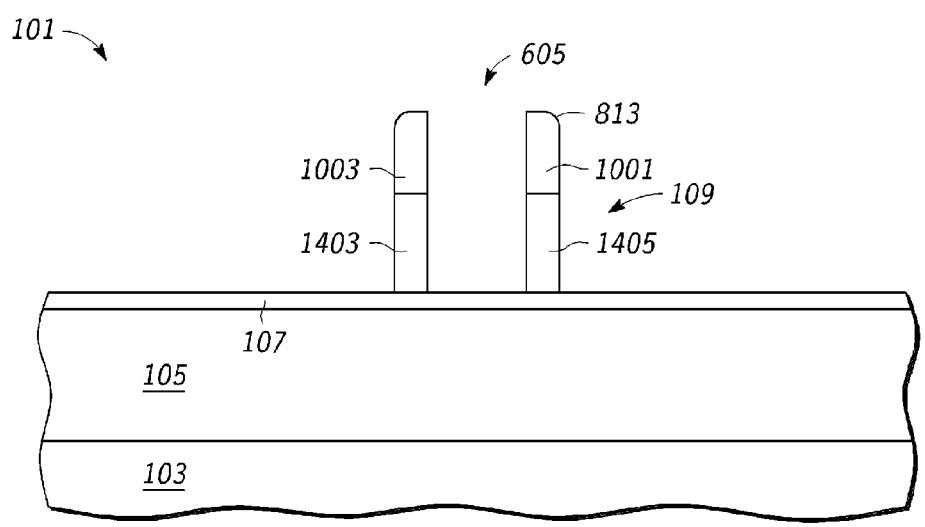

Referring to FIG. 14, the remaining portion of oxide 813 is utilized to pattern layer 109 and subsequently to pattern layer 105. In patterning layer 109, portions of layer 109 located outside of oxide 813 are removed. Referring to FIG. 14, this removal is preformed with an etchant that removes nitride and is selective to oxide to expose layer 107 in the uncovered portions. In the embodiment shown, oxide structures 1001 and 1003 are utilized to pattern nitride structures 1403 and 1405.

Figure 15:
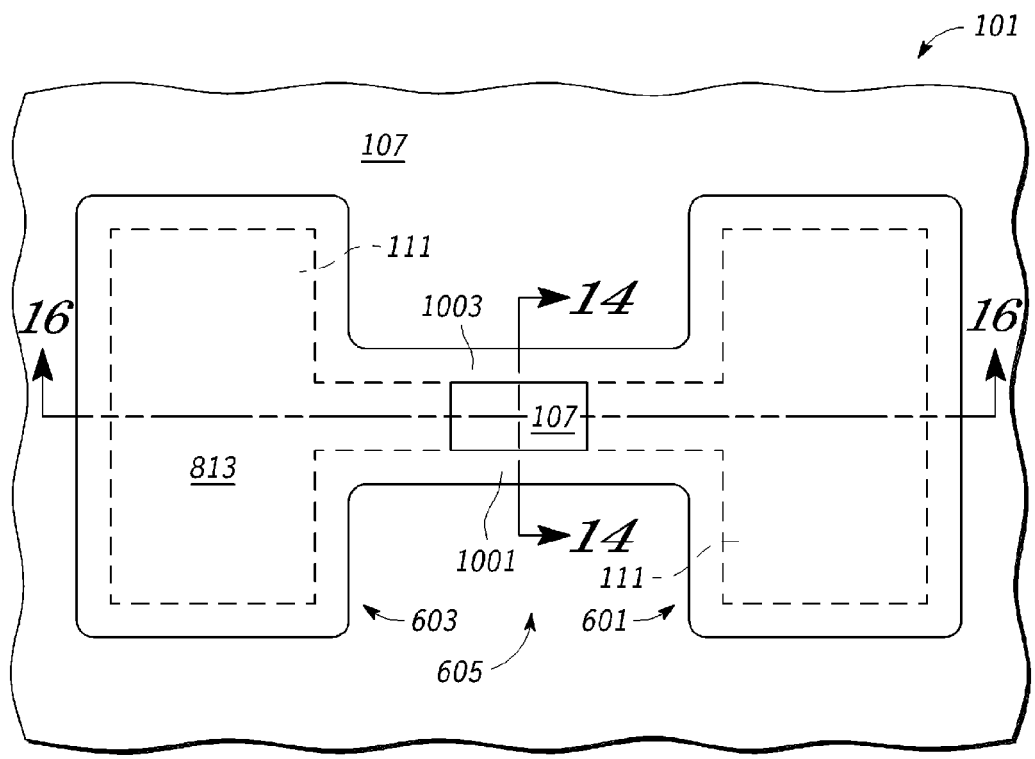

FIG. 15 is a partial top view of wafer 101 at the same stage as that of FIG. 14. As shown in FIG. 15, the removal of nitride layer 109 as per the pattern of oxide 813 exposes layer 107, including at a location between structure 1001 and 1003 in region 605.

Figure 16:
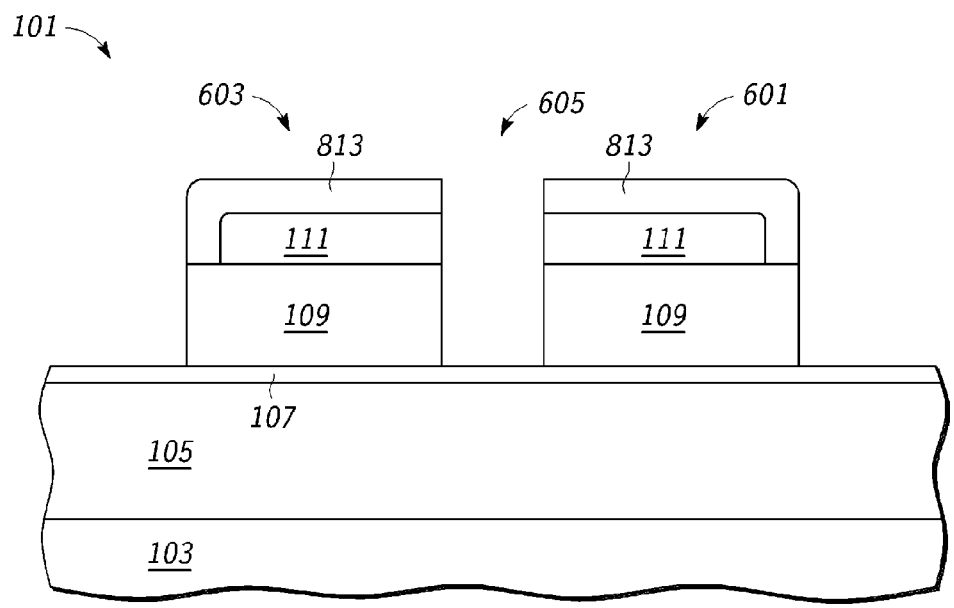

FIG. 16 is a partial side cross sectional view of wafer 101 at the same stage shown in FIGS. 14 and 15. In the embodiment of FIG. 16, portions of layer 111 that are covered by oxide 813 remain in regions 601 and 603. However, in other embodiments, all of layer 111 in regions 601 and 603 would be oxidized.

Figure 17:
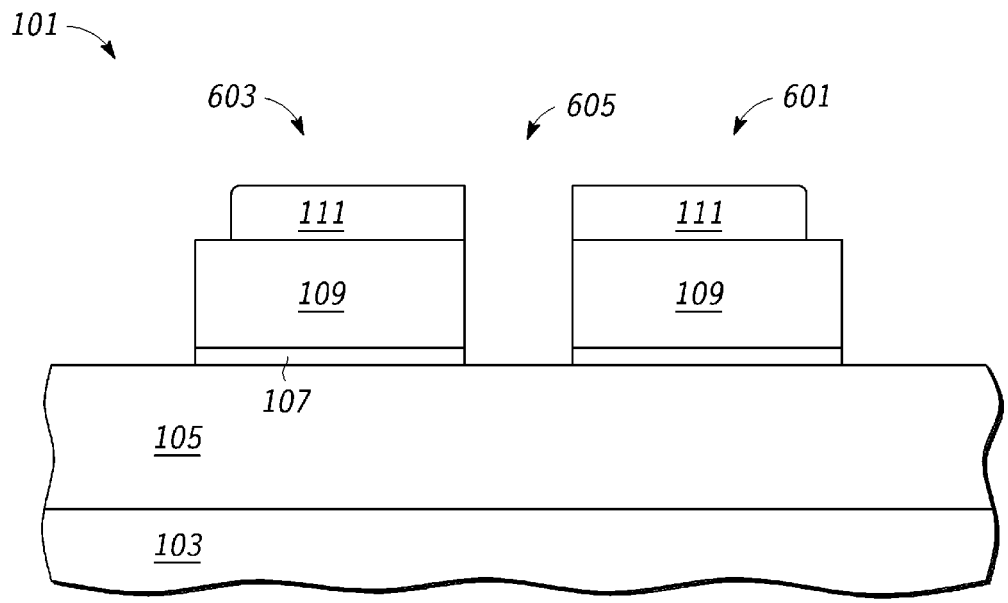

FIG. 17 shows the same partial side cross sectional view as FIG. 16 after the removal of oxide 813 and exposed portions of layer 107. In one embodiment, the oxide is removed with an etchant that is selective to nitride and the silicon (or other material) of layer 105 and selective with respect to oxide. In one embodiment, an HF wet dip or exposure to $C_4F_8$, Argon, and CO gases may be utilized. In some embodiments, oxide 813 is not removed prior to the etching of layer 105 or may be removed at subsequent stages.

Figure 18:
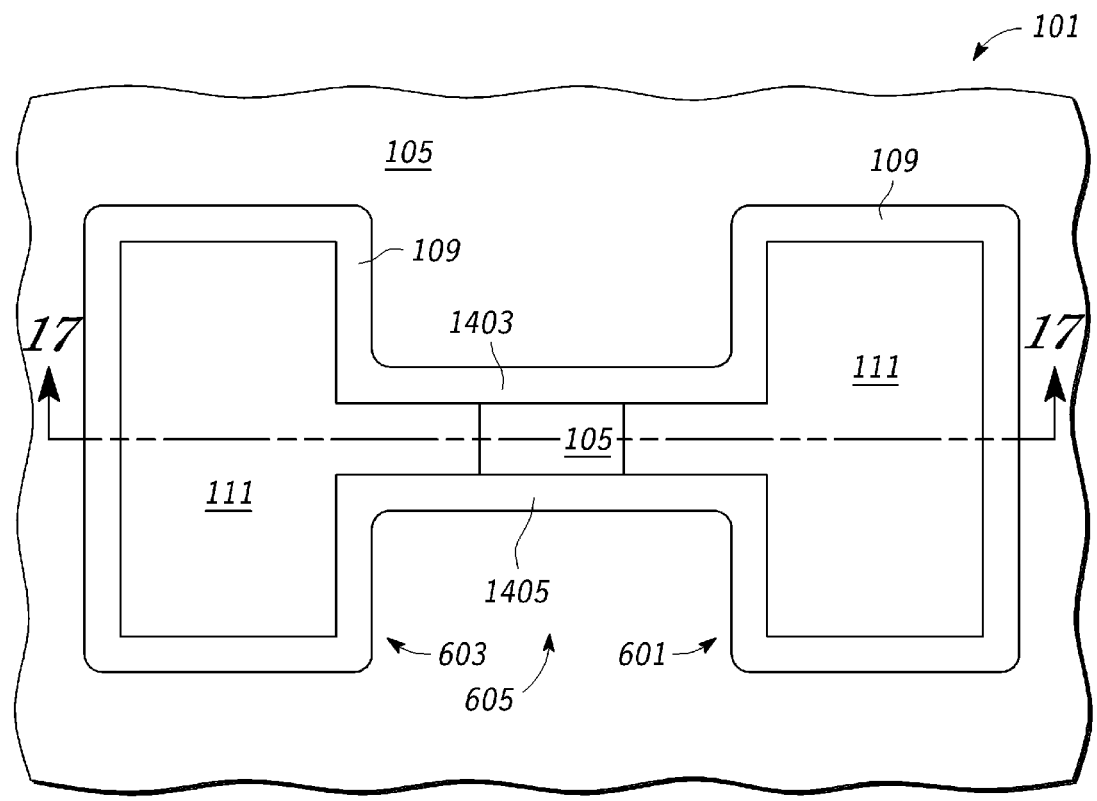

FIG. 18 is a partial top view of wafer 101 at the same stage as FIG. 17. In the embodiment of FIG. 18, remaining portions of layer 111 in regions 601 and 603 are exposed from the removal of oxide 813.

Figure 19:
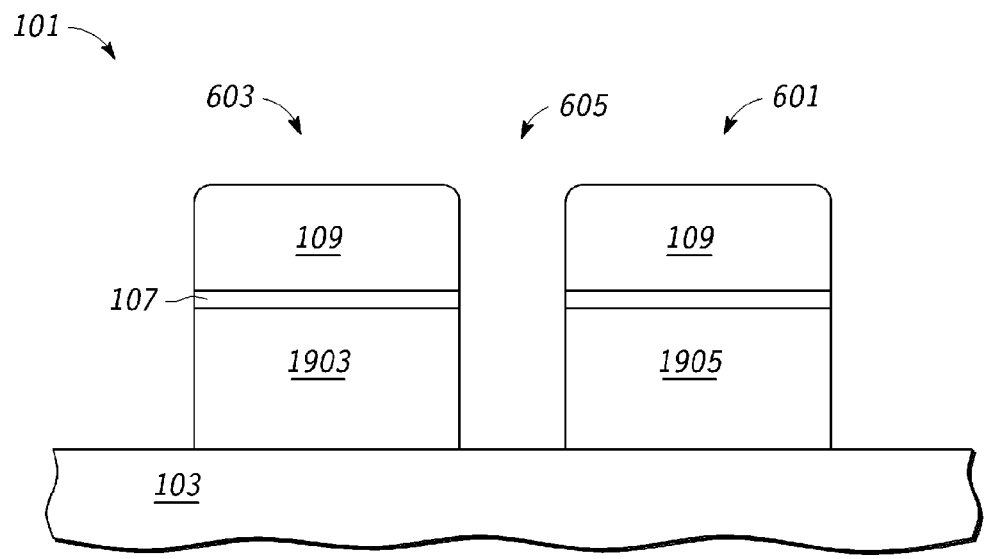
Figure 20:
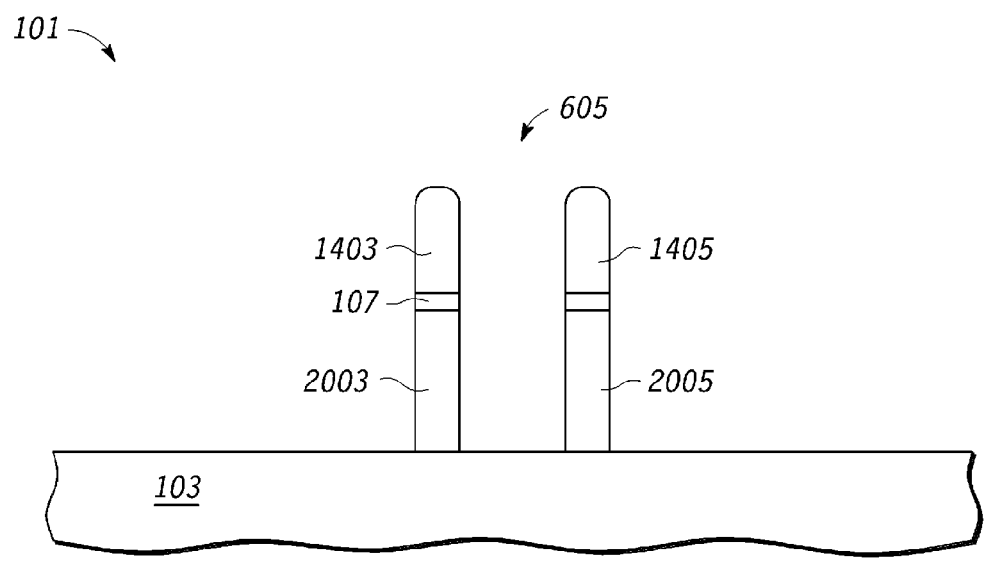
Figure 21:
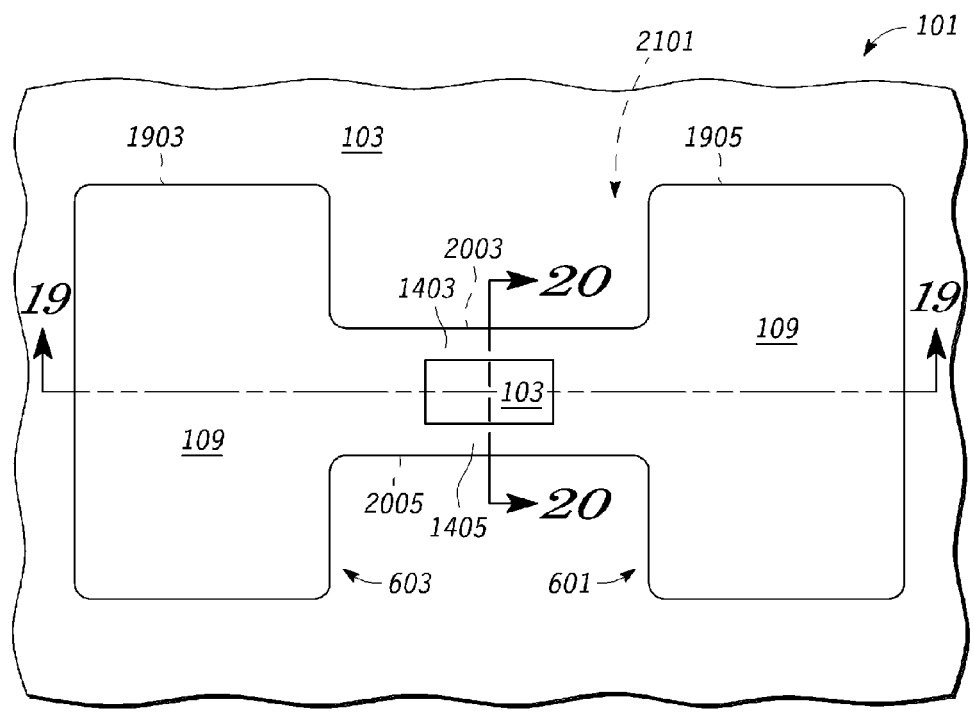

FIGS. 19 and 20 are partial side cross sectional views and FIG. 21 is a partial top view of wafer 101 after layer 105 is patterned as per the pattern of layer 109 (from the view shown in FIG. 18). During this patterning, any remaining portion of layer 111 is removed from over layer 109.

In one embodiment, the portions of layer 105 are removed by etching portions of layer 105 not covered by layer 109. In one embodiment, layer wafer 101 is subjected to an etchant that is selective to the nitride of layer 109 and the oxide of layer 103 and selective with respect to the material of layer 105.

In another embodiment, layer 105 maybe patterned in a multistage process where a portion of layer 105 is removed using a non selective etch (e.g. $CF_4$) that also removes a portion of layer 109. Wafer 101 is then subjected to a second etch that is anisotropic and is somewhat more selective to nitride than a non selective etch. The use of the anisotropic etch provides for relatively smoother and more vertical sidewalls of the remaining structures of layer 105. A third etch would be used to etch the remaining exposed portions of layer 105. This third etch would be selective to the material of layer 103. In some embodiments, this etchant may be selective to the nitride of layer 109. In some embodiments, a portion of layer 109 may remain after the patterning of layer 105. In other embodiments, layer 109 may be removed.

In another embodiment, a partial etch of layer 105 is performed to allow layer 109 to be removed prior to exposing layer 103. In this embodiment, layer 107 is used as a hard mask for the remaining portion of layer 105. This embodiment is preferable when layer 109 needs to be removed prior to subsequent processing and the processing used to remove it may cause undesirable loss of layer 103 if it were exposed. In this embodiment, layer 107 maybe of a thicker dimension.

Referring to FIG. 20, nitride structures 1403 and 1405 are utilized to form semiconductor fin structures 2003 and 2005 in layer 105. In one embodiment, the spacing between fin structures 2003 and 2005 (the left to right dimension shown in FIG. 20) is less than the critical dimension of the photo lithographic processes used in making wafer 101. This may allow for the placement of more fins per unit area.

As shown in FIG. 19, the patterning of layer 105 in region 601 and 603 forms source/drain structures 1903 and 1905 in layer 105, respectively.

FIG. 21 shows the pattern of the overall semiconductor multi-fin structure 2101 in layer 105. In FIG. 21, this pattern is the pattern of layer 109 which covers the remaining portion of layer 105. As shown in FIG. 21, layer 103 is exposed between fin structure 2003 (located under structure 1403) and fin structure 2005 (located under structure 1405).

In some embodiments, the structure 2101 of layer 105 may be subject to further processes such as e.g. thinning of structures 2003 and 2005 (utilized with a subsequent oxidation process) and ion implantation for doping of the channel regions.

Figure 22:
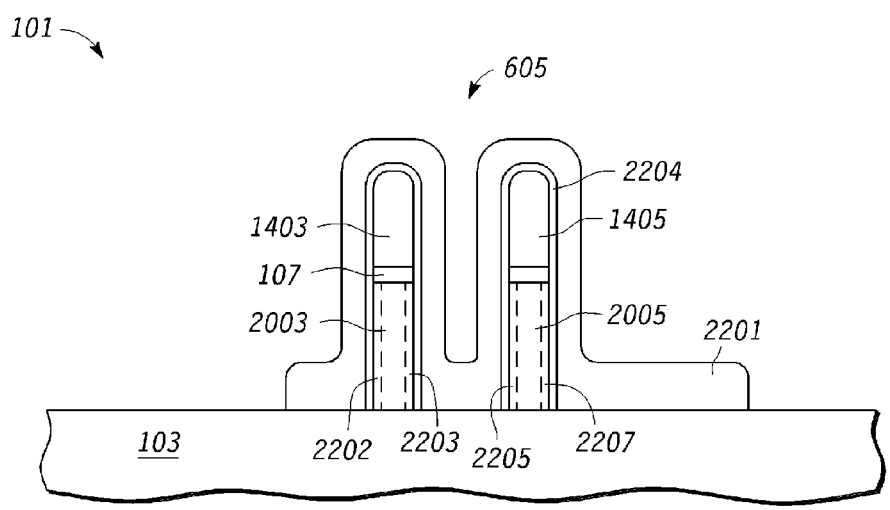

FIG. 22 shows a partial side view of wafer 101 after a gate structure 2201 is formed over fin structures 2003 and 2005. In one embodiment, gate structure 2201 is formed by forming a gate oxide 2204 over the fin structures and then depositing a layer of gate material (e.g. polysilicon) over the gate oxide 2204. The layer of gate material is then patterned. In some embodiments, the layer of gate material may be planarize before patterning to reduce the topography for gate patterning.

After formation of gate structure 2201, the source/drain regions are formed (e.g. by ion implantation) in the semiconductor layer 105 outside of gate structure 2201. In the embodiment shown, the source/drain regions are located in source/drain structures 1903 and 1905 as well as in portions of fin structures 2003 and 2005 located outside of gate structure 2201. In one embodiment, the portions of layer 109 located outside of gate structure 2201 are removed prior to implanting the source/drain regions.

In the embodiment shown, a voltage (above a threshold voltage) applied to gate structure 2201 forms an inversion layer in the vertical channel regions 2202, 2203, 2205, and 2207 located along the sidewalls of structures 2003 and 2005. The carrier transport (e.g. electrons or holes) is substantially horizontal (into or out of the page in the view of FIG. 22) in the channel regions when a threshold voltage is applied to gate structure 2201. In some embodiments, the channel regions may have a different depth than that shown in FIG. 22. For example, in some embodiments, the channel regions may overlap within a fin structure (e.g. channel regions 2202 and 2203 would overlap within fin structure 2003).

Figure 23:
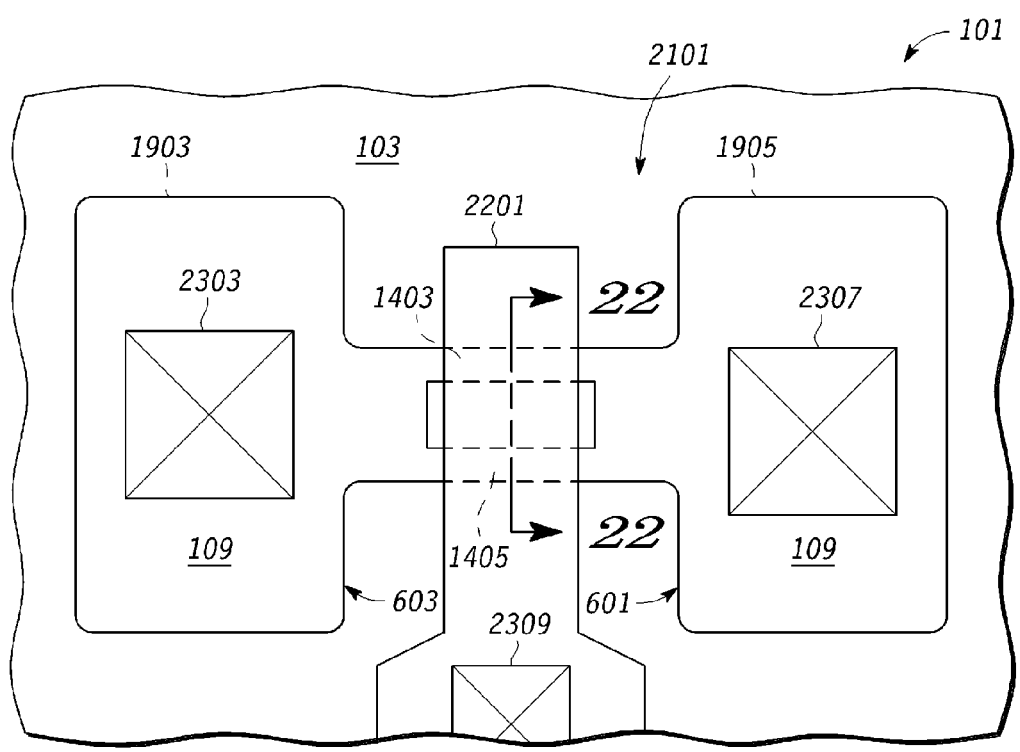

FIG. 23 is a partial top view of wafer 101 after the formation of source/drain contacts 2303 and 2307 in to source/drain structures 1903 and 1905, respectively. FIG. 23 also shows a gate contact 2309 to gate structure 2201.

Subsequent processes may be preformed on wafer 101 including e.g. the formation of interconnect layers (interconnects and interlayer dielectrics) and connection structures (e.g. bond pads) over layer 103 and the remaining portions of layer 105. The wafer may be singulated (e.g. with a saw) into multiple integrated circuit die and then packaged into integrated circuit packages.

Although only one multi-fin FinFET is shown in the Figures, other portions of wafer 101 may include other FinFETs formed concurrently with the FinFET shown. Some of these other finFETS may be interconnected. The FinFETs maybe of an N-channel type conductively or a P-channel type conductivity depending upon channel and source/drain doping.

The utilization of oxidized structures in the patterning of a semiconductor fin structures may provide for a FinFET where the spacings between fin structures are of sub-lithographic dimensions. Furthermore, the use of oxidized structures may allow for a shorter initial patterning structure (e.g. the patterned structure of layer 111 in FIG. 10) than may be achieved with the use of spacer patterning structures for fin definition. The use of shorter structures may allow for such initial structures to be narrower, thereby reducing fin structure spacing.

The Figures show the formation of a multi-fin semiconductor structure 2101 having two fin structures 2003 and 2005. However, in other embodiments, only one fin structure may be formed. Still in other embodiments, a greater number of fin structures may be formed. For example, in FIG. 2, only one fin structure (205) extending between structure 203 and 201 is shown. Such a structure 205 results in two semiconductor fin structures 2003 and 2005 being formed in layer 105 in the embodiment shown. However, in other embodiments, multiple structures extending between structures 201 and 203 and spaced apart may be formed thereby resulting in a greater number of fin structures extending between structures 1903 and 1905.

Although the layers used for patterning (e.g. 115, 113, 111, 109, and 107) are described above with specific materials (e.g. oxide, nitride) in specific combinations, other embodiments may utilize other materials in the patterning layers, in different combinations, and/or different configurations. In such embodiments, the etch chemistries utilized to remove such material would be etch selective with respect to with respect to those material as described above or by other processes.

Although the above description is described in relation to a finFET, the use of oxidizable structures to form channel structures may be utilized in other types of transistors including other types of transistors e.g. including other types of transistors having vertical channel regions with substantial horizontal carrier transport in those regions.

Although, the above description is described in relation to forming a fin structure, other structures (e.g. mesas) may be formed by using the oxide from the oxidation of the oxidizable material as a pattern.

In one embodiment, a method of making a semiconductor device includes providing a substrate having a semiconductor layer and forming a pattern for forming semiconductor structures in the semiconductor layer. The method for forming a pattern includes providing an oxidizable layer over the semiconductor layer, oxidizing sidewalls of the oxidizable layer to form oxide masks, and after the oxidizing, removing material of the oxidizable layer while leaving the oxide masks as a pattern for forming semiconductor structures.

In another embodiment, a method of forming fins in a semiconductor layer includes forming a first layer over the semiconductor layer, forming an oxidizable layer over the first layer, forming a first mask over the oxidizable layer, etching the oxidizable layer according to the first mask, and forming a second mask over a region for the fins after the etching the oxidizable layer. The method also includes performing an oxidation process to form two oxide structures on two opposing side walls of the oxidizable layer at a location of the second mask, removing the oxidizable layer between the two oxide structures after the performing the oxidation process, and etching through the first layer including at a location of the removed oxidizable layer between the two oxides structures. The etching results in leaving material of the first layer at locations of the two oxide structures. The method further includes etching the semiconductor layer to form two fins at locations of the two oxide structures.

In another embodiment, a method of making a semiconductor device structure includes providing a semiconductor layer, a first layer over the semiconductor layer, an oxidizable layer over the first layer, and a mask layer over the oxidizable layer. The method also includes patterning the mask layer to leave a first source/drain pattern and a second source/drain pattern, and a channel pattern in between the first source/drain pattern and second source/drain pattern. The method further includes patterning the oxidizable layer according to the first source/drain pattern, the second source/drain pattern, and the channel pattern to leave source/drain pattern portions of the oxidizable layer under the first source/drain pattern and the second source/drain pattern and a channel pattern portion of the oxidizable layer under the channel pattern. Sidewalls of the source/drain pattern portions of the oxidizable layer and the channel pattern portion of the oxidizable layer are exposed. The method also includes applying a patterned mask over the channel pattern, removing the first source/drain pattern and the second source/drain pattern over the source/drain pattern portions of the oxidizable layer, and performing oxidation to cause growth of oxide on two sidewalls of the channel pattern portion of the oxidizable layer and an oxide layer over the source/drain pattern portions of the oxidizable layer. The method also includes removing the patterned mask over the channel pattern, removing a portion of the oxidizable layer at a location of the patterned mask between the oxide on the two sidewalls of the channel pattern portion, and after removing the portion of the oxidizable layer, patterning the semiconductor layer. The patterning the semiconductor layer includes forming two semiconductor structures at locations of the oxide previously on the two sidewalls of the channel pattern portion.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a semiconductor device, comprising:
   providing a substrate having a semiconductor layer; and
   forming a pattern for forming semiconductor structures in the semiconductor layer; the step of forming a pattern comprising:
      providing an oxidizable layer over the semiconductor layer;
      oxidizing sidewalls of the oxidizable layer to form oxide masks;
      after the oxidizing, removing material of the oxidizable layer while leaving the oxide masks as a pattern for forming semiconductor structures forming a mask over the oxidizable layer; and
      patterning the oxidizable layer according to the mask to form a first source/drain pattern portion, a second source/drain pattern portion, and a channel pattern portion of the oxidizable layer.

2. The method of claim 1, further comprising:
   forming a mask layer over the semiconductor layer prior to forming the oxidizable layer; and
   patterning the mask layer.

3. The method of claim 2, wherein the oxidizable layer used in the step of oxidizing comprises amorphous silicon and the mask layer used in the step of oxidizing comprises silicon nitride.

4. The method of claim 2, further comprising forming an oxide layer over the semiconductor layer prior to forming the mask layer.

5. The method of claim 2, wherein the forming the pattern further comprises forming an oxide layer over the oxidizable layer prior to forming the mask layer.

6. The method of claim 1, wherein the forming the pattern further comprises removing the mask over the first and second source/drain pattern portions while leaving a portion of the mask over the channel pattern portion prior to the oxidizing.

7. The method of claim 6 further comprising:
   removing the portion of the mask over the channel pattern portion after the oxidizing; and
   wherein the removing material of the oxidizable layer includes removing the oxidizable layer in the channel pattern portion at a location of the portion of the mask over the channel pattern portion.

8. The method of claim 7, wherein the forming the pattern further comprises:
   forming a mask layer over the semiconductor layer prior to forming the oxidizable layer; and
   removing the mask layer at a location of the oxidizable layer in the channel pattern portion removed by the removing the oxidizable layer in the channel pattern portion at a location of the portion of the mask over the channel pattern portion.

9. The method of claim 1, wherein the forming the pattern further comprises patterning the oxidizable layer prior to the oxidizing the sidewalls.

10. The method of claim 1, wherein the step of oxidizing the sidewalls forms an oxide such that it is selectively etchable with respect to the oxidizable layer.

11. The method of claim 1 further comprising:
patterning the oxidizable layer, wherein the patterning forms a first sidewall and a second sidewall, wherein the first sidewall is an opposite sidewall to the second sidewall;
wherein the oxidizing sidewalls of an oxidizable layer to form oxide masks includes oxidizing the first sidewall to form a first oxide mask and oxidizing the second sidewall to form a second oxide mask;
wherein the removing material of the oxidizable layer while leaving the oxide masks as the pattern further includes removing material of the oxidizable layer between the first oxide mask and the second oxide mask.

12. The method of claim 11 further comprising:
patterning the semiconductor layer to form a first structure at a location of the first oxide mask and to form a second structure at a location of the second oxide mask, wherein the patterning removes material of the semiconductor layer at the location of the material of the oxidizable layer between the first oxide mask and the second oxide mask.

13. The method of claim 1 further comprising:
using the pattern to form fins in the semiconductor layer.

14. The method of claim 1 further comprising:
forming channel regions in the semiconductor structures.

15. The method of claim 1 wherein
wherein the oxidizable layer includes nitride and the oxidizing includes performing an in situ steam generated oxidation process.

16. A method of forming fins in a semiconductor layer, comprising
forming a first layer over the semiconductor layer;
forming an oxidizable layer over the first layer;
forming a first mask over the oxidizable layer;
etching the oxidizable layer according to the first mask;
forming a second mask over a region for the fins after the etching the oxidizable layer, wherein the forming the second mask includes forming the second mask over a portion of the etched oxidizable layer;
performing an oxidation process to form two oxide structures on two opposing side walls of the oxidizable layer at a location of the second mask;
removing the oxidizable layer between the two oxide structures after the performing the oxidation process;
etching through the first layer including at a location of the removed oxidizable layer between the two oxides structures, wherein the etching results in leaving material of the first layer at locations of the two oxide structures;
etching the semiconductor layer to form two fins at locations of the two oxide structures.

17. The method of claim 16 wherein the step of forming the oxidizable layer comprises forming the oxidizable layer of amorphous silicon.

18. The method of claim 16, wherein the etching the semiconductor layer to form two fins at locations of the two oxide structures is performed subsequent to the removal of the two oxide structures.

19. The method of claim 16, wherein:
the etching the oxidizable layer is further characterized as leaving a first source/drain pattern structure and a second source/drain pattern structure;
the performing an oxidation process is further characterized as growing oxide on the first source/drain pattern structure and on the second source/drain pattern structure which is used to prevent removal of the first layer at those locations; and
the etching the semiconductor layer is further characterized as leaving a first source/drain structure and a second source/drain structure in the semiconductor layer connected to the fins.

20. A method of making a semiconductor device structure, comprising:
providing a semiconductor layer, a first layer over the semiconductor layer, an oxidizable layer over the first layer, and a mask layer over the oxidizable layer;
patterning the mask layer to leave a first source/drain pattern and a second source/drain pattern, and a channel pattern in between the first source/drain pattern and second source/drain pattern;
patterning the oxidizable layer according to the first source/drain pattern, the second source/drain pattern, and the channel pattern to leave source/drain pattern portions of the oxidizable layer under the first source/drain pattern and the second source/drain pattern and a channel pattern portion of the oxidizable layer under the channel pattern, whereby sidewalls of the source/drain pattern portions of the oxidizable layer and the channel pattern portion of the oxidizable layer are exposed;
applying a patterned mask over the channel pattern;
removing the first source/drain pattern and the second source/drain pattern over the source/drain pattern portions of the oxidizable layer;
performing oxidation to cause growth of oxide on two sidewalls of the channel pattern portion of the oxidizable layer and an oxide layer over the source/drain pattern portions of the oxidizable layer;
removing the patterned mask over the channel pattern;
removing a portion of the oxidizable layer at a location of the patterned mask between the oxide on the two sidewalls of the channel pattern portion;
after removing the portion of the oxidizable layer, patterning the semiconductor layer, wherein the patterning the semiconductor layer includes forming two semiconductor structures at locations of the oxide previously on the two sidewalls of the channel pattern portion.

21. The method of claim 20, wherein:
the patterning the semiconductor layer is further characterized as leaving a first source/drain region and a second source/drain region in the semiconductor layer coupled to the two semiconductor structures.

* * * * *